United States Patent
Logan et al.

(10) Patent No.: US 6,268,994 B1
(45) Date of Patent: Jul. 31, 2001

(54) ELECTROSTATIC CHUCK AND METHOD OF MANUFACTURE

(75) Inventors: Joseph Logan, Jamestown, RI (US); Robert Tompkins, Millbrook; John R. Miller, Wappingers Falls, both of NY (US)

(73) Assignee: Dorsey Gage, Inc., Poughkeepsie, NY (US)

( * ) Notice: Subject to any disclaimer, the term of this patent is extended or adjusted under 35 U.S.C. 154(b) by 0 days.

(21) Appl. No.: 09/350,726

(22) Filed: Jul. 9, 1999

(51) Int. Cl.[7] .................................................. H02N 13/00
(52) U.S. Cl. ............................................ 361/234; 279/128
(58) Field of Search ................................... 361/230–235; 29/825, 829; 279/128

(56) References Cited

U.S. PATENT DOCUMENTS

| | | |
|---|---|---|
| 5,055,964 | 10/1991 | Logan et al. . |
| 5,151,845 | 9/1992 | Watanabe et al. . |
| 5,191,506 | 3/1993 | Logan et al. . |
| 5,207,437 | 5/1993 | Barnes et al. . |
| 5,535,090 * | 7/1996 | Sherman .............................. 361/234 |
| 5,572,398 | 11/1996 | Federlin et al. . |
| 5,600,530 * | 2/1997 | Smith .................................... 361/234 |
| 5,691,876 | 11/1997 | Chen et al. . |
| 5,754,391 | 5/1998 | Bates . |
| 5,781,400 * | 7/1998 | Takahashi et al. ................... 361/234 |
| 5,886,863 * | 3/1999 | Nagasaki et al. .................... 361/234 |
| 5,946,184 * | 8/1999 | Kanno et al. ........................ 361/234 |

* cited by examiner

*Primary Examiner*—Fritz Fleming
(74) *Attorney, Agent, or Firm*—Joseph L. Spiegel

(57) ABSTRACT

An electrostatic chuck is formed by: providing a conductive base member; machining a pattern of ridges in the top surface of the base member; providing through holes in the base member; inserting insulated contact posts into through holes and joining same to the base member in such manner that the contact posts extend above the top surface of the base member; depositing a first insulating layer over the base member top surface, ridges and the contact posts, the thickness of the insulating layer being less than the height of the contact posts above the base member surface; removing the first insulative layer from the top of the contact posts and removing a portion of the contact posts in such manner that the contact posts are flush with the surrounding first insulating layer; depositing a conductive layer over the first insulating layer and the tops of the contact posts, the thickness of the conductive layer being approximately the height of the ridges; grinding the top surface of the base member flat to the point of exposing the first insulating layer over the ridges to form separate electrodes; depositing a second insulating layer over the conductive layer and first insulating layer; and, joining the conductive base member to a supporting frame.

6 Claims, 4 Drawing Sheets

MACHINED BASE WITH
WITH ELECTRICAL FEED-THROUGHS

FIRST INSULATION LAYER
APPLIED

REMOVE FIRST INSULATION LAYER
FROM FEEDTHRU

APPLY CONDUCTIVE LAYER

GRIND FLAT TO SEPARATE ELECTRODES

DEPOSIT SECOND INSULATOR LAYER

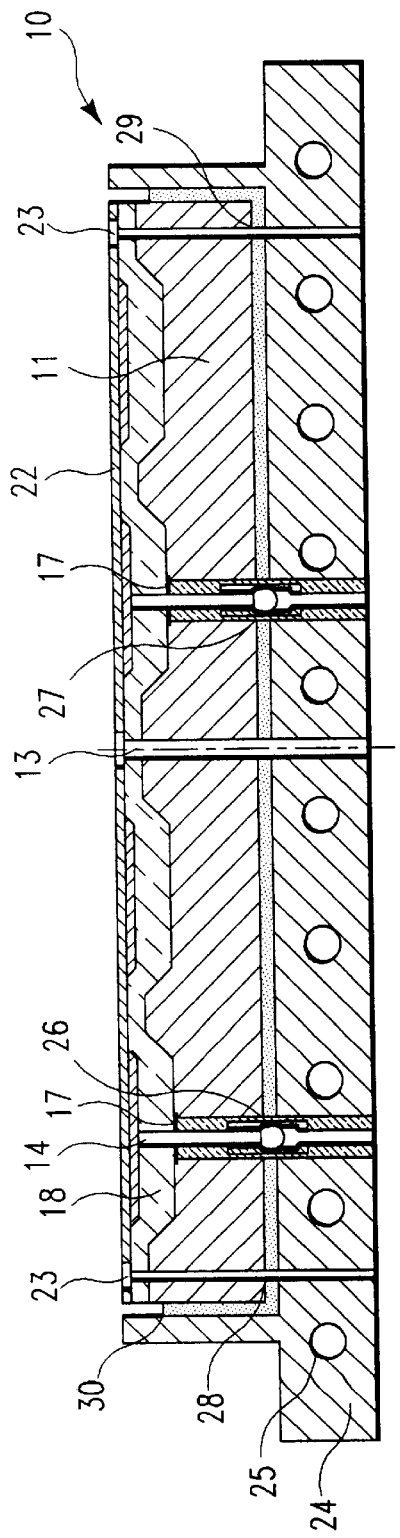
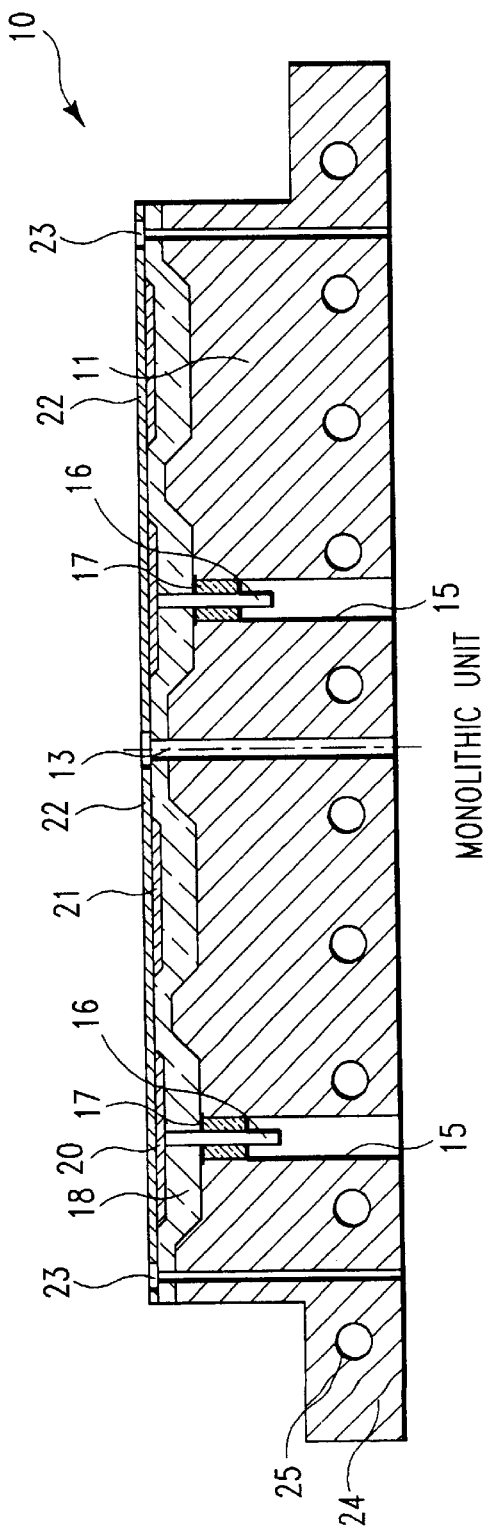
FIG. 7a — JOIN CHUCK TO SUPPORT/SERVICE PLATE
FIG. 7b — MONOLITHIC UNIT

ELECTROSTATIC CHUCK AND METHOD OF MANUFACTURE

BACKGROUND OF THE INVENTION

1. Field of Invention

This invention relates generally to electrostatic chucks and their method of manufacture and, in particular, to such chucks that can be manufactured to relatively high standards, for relatively low costs while at the same time eliminating cumbersome manufacturing techniques.

2. Description of the Prior Art

Prior art attempts to accomplish the goals to which this invention is directed, have met with limited success.

U.S. Pat. No. 5,055,964 to Logan, et al discloses a bipolar chuck using an anodized ring insert in an anodized base.

U.S. Pat. No. 5,572,398 to Federlin, et al discloses a tripolar electrostatic chuck using separate positive and negatives electrodes housed on a non-polarized base housing.

The technologies described in U.S. Pat. Nos. 5,055,964 and 5,572,398 are relatively low-cost technologies but suffer the disadvantage that the separate clamping electrodes must be joined to a framed in careful alignment to achieve flatness. The best flatness that can be achieved in manufacturing is about +/−0.00015 inch (+/−3.75 microns) without a final mechanical grinding or lapping step, which causes insulator thickness non-uniformity. Furthermore, U.S. Pat. No. 5,055,964 has inherently unbalanced rf capacitance as well as non-uniform heat transfer for the 2 poles.

In U.S. Pat. No. 5,207,437 to Barnes, et al and U.S. Pat. No. 5,191,506 to Logan, et al, an electrostatic chuck is disclosed including fired ceramic sheets containing metallic layers within, which are then bonded to a metal cooling/heating assembly containing connections to the electrostatic chuck electrodes.

Fired ceramic sheets consisting of conductive layers embedded in a ceramic matrix can be made but must have significant thickness to maintain physical strength and rigidity. This thickness causes the thermal resistance and rf impedance to be much higher compared to sprayed ceramic layers over metal. Cost of these ceramic structures is usually high.

U.S. Pat. No. 5,691,876 to Chen, et al describes an electrostatic chuck with organic coatings, such as polyimide (Kapton) over a metal chuck assembly.

Organic insulators with metal electrodes embedded are commonly bonded to metal frames to make electrostatic chucks. These chucks have good uniform rf coupling and cooling but suffer the disadvantage that they are not robust and are easily attacked by reactive chemicals in a plasma environment and may be easily damaged by physical abrasion.

In U.S. Pat. No. 5,754,391 to Bates crystalline insulator coatings such as sapphire, usually thick sheets, are bonded to the metal chuck surface.

Crystalline insulator coatings such as sapphire have excellent insulating properties but are expensive and difficult to manufacture in thin coatings required for low operating voltage and high thermal conductivity coupling capacitance.

Watanabe, et al U.S. Pat. No. 5,151,846 discloses the fabrication of an electrostatic chuck by pressing a plurality of given ceramic sheets in the form of pastes with electrode films printed thereon, against a ceramic green sheeting serving as a base plate and then firing the laminated body.

SUMMARY OF THE INVENTION

An object of the present invention is an electrostatic chuck having high and uniform thermal conductivity between clamping surface and coolant channels.

Another object is such a chuck with exceptional flatness.

Still another object is such a chuck with high capacitance between clamping surface and the metallic chuck body.

A further object is such a chuck with balanced rf capacitance with more than one pole.

A still further object is such a chuck with a ceramic insulator or semiconductive covering and completely isolating the clamping electrodes from outside except at the connections.

Yet another object is such a chuck with backside cooling gas supply channels that do not contact the clamping electrodes internally.

Yet still another object is such a chuck that can be manufactured at low cost.

These and other objects features and advantages of the present invention are accomplished in accordance with the teachings of the present invention, one illustrative embodiment of which comprises forming an electrostatic chuck by: providing a conductive base member; machining a pattern of ridges in the top surface of the base member; providing through holes in the base member; inserting insulated contact posts into through holes and joining same to the base member in such manner that the contact posts extend above the top surface of the base member; depositing a first insulating layer over the base member top surface, ridges and the contact posts, the thickness of the insulating layer being less than the height of the contact posts above the base member surface; removing the first insulating layer from the top of the contact posts and removing a portion of contact posts in such manner that the contact posts are flush with the surrounding first insulating layer; depositing a conductive layer over the first insulating layer and the tops of the contact posts, the thickness of the conductive layer being approximately the height of the ridges; grinding the top surface of the base member flat to the point of exposing the first insulating layer over the ridges to form separate electrodes; depositing a second insulating layer over the conductive layer and first insulating layer; and, joining the conductive base member to a supporting frame.

BRIEF DESCRIPTION OF THE DRAWING

Other objects, features and advantages of the invention will be apparent from the following description and accompanying drawing, wherein:

FIG. 7B is a cross sectional view of a completed electrostatic chuck when formed as a monolithic unit.

DETAILED DESCRIPTION

Figure 1A:
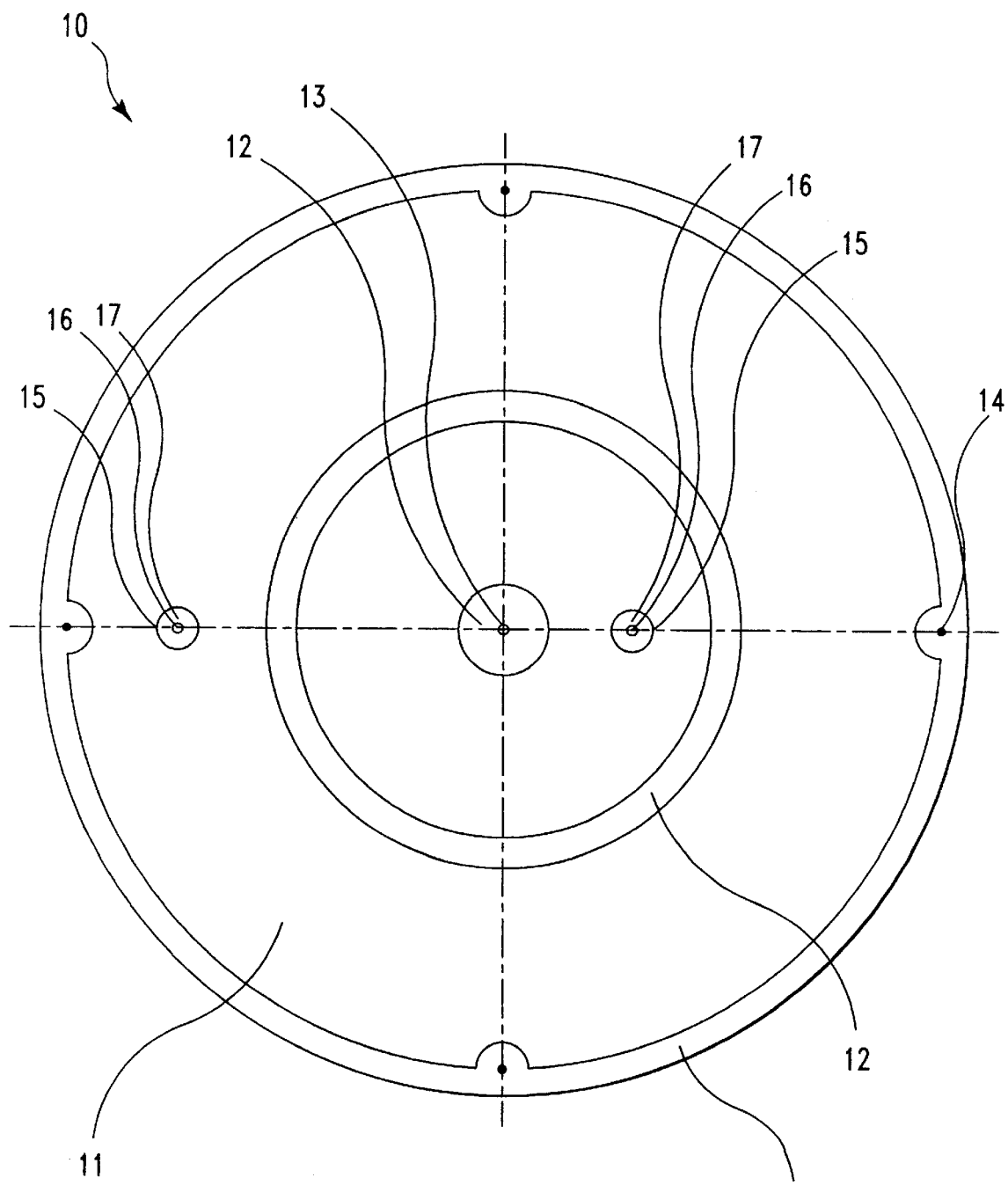
FIG. 1A is a top plan view of an electrostatic chuck constructed according to the teachings of the present invention at an initial phase showing a machined base with ridges, through holes and contact parts.

In the drawing so much of an electrostatic chuck and parts are shown as is necessary for an understanding of the present invention.

Figure 1B:
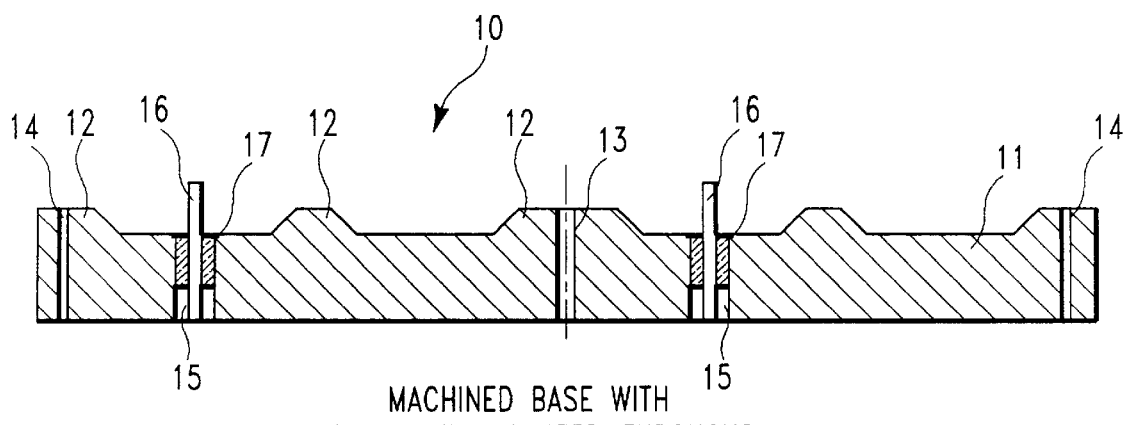
FIG. 1B is a cross sectional view of the chuck of FIG. 1A.

Referring first to FIG. 1A and FIG. 1B, there is shown a portion of electrostatic chuck 10 that includes a single conductive base member 11 as, for example, a disk of aluminum, molybdenum or titanium. Base member 11 is machined with a pattern of ridges 12 on its surface. This pattern of ridges 12 outlines the perimeters of the electrodes, whatever shapes and sizes are desired. The ridges 12 also surround through holes such as lift pin hole 13 and gas-feed hole 14. Through holes 15 are also provided in base member 11 for inserting metal contact posts or feed throughs 16 that may be welded in place as shown at 17. Contact posts 16 may be, for example, a commercially available ceramic-metal feed through.

Figure 2:
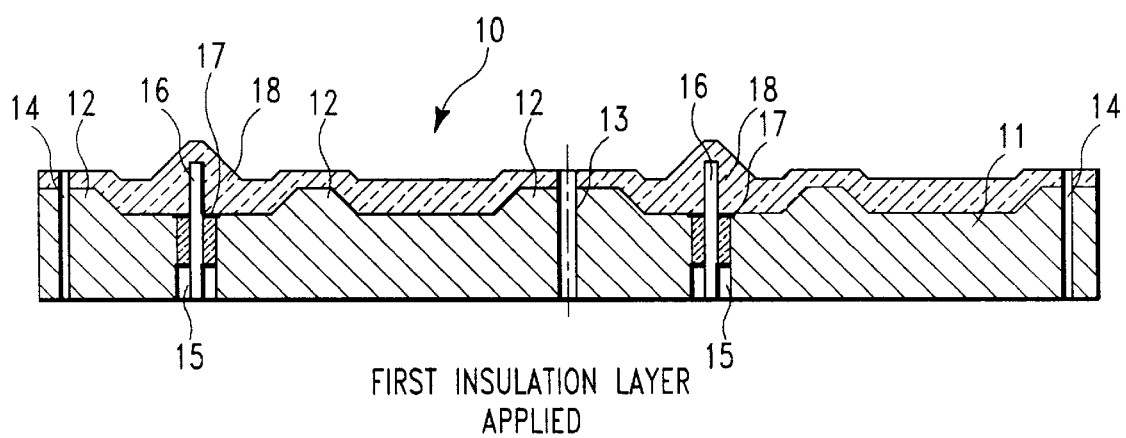
FIG. 2 is a cross sectional view of the electrostatic chuck of FIG. 1 being formed showing application of an initial insulation layer.

Referring to FIG. 2, in the next operation a first insulating layer 18, for example, aluminum oxide, is deposited to a thickness in the range of 0.010 inches (0.254 mm) by an appropriate process such as thermal spraying. The thickness may be varied but should be kept as thin as possible and as uniform as possible consistent with electrical breakdown requirements. A thin binding layer, for example, molybdenum (not shown) may be used to improve adhesion and create stress relief between layer 18 and base member 11. Also, the height of the contact posts 16 above the surface of base member 11 must exceed the thickness of the insulating layer 18.

Figure 3:
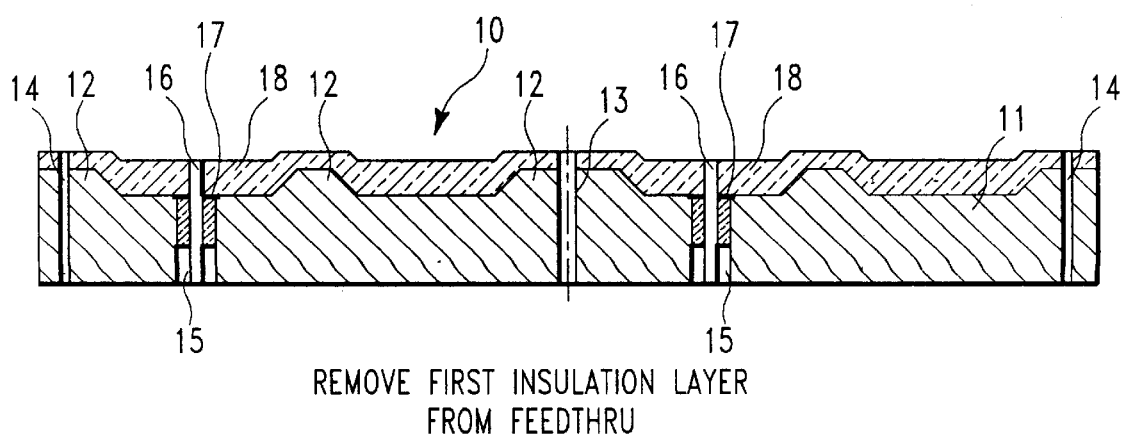
FIG. 3 is a cross sectional view of the electrostatic chuck being formed after removal of the first insulating layer from the electrical feed throughs.

In the next operation and referring to FIG. 3, the contact posts or electrical feed through 16 are uncovered and made flush to the surrounding surface by grinding or otherwise removing locally the first insulating layer 18 and the top of the metal posts 16.

Figure 4:
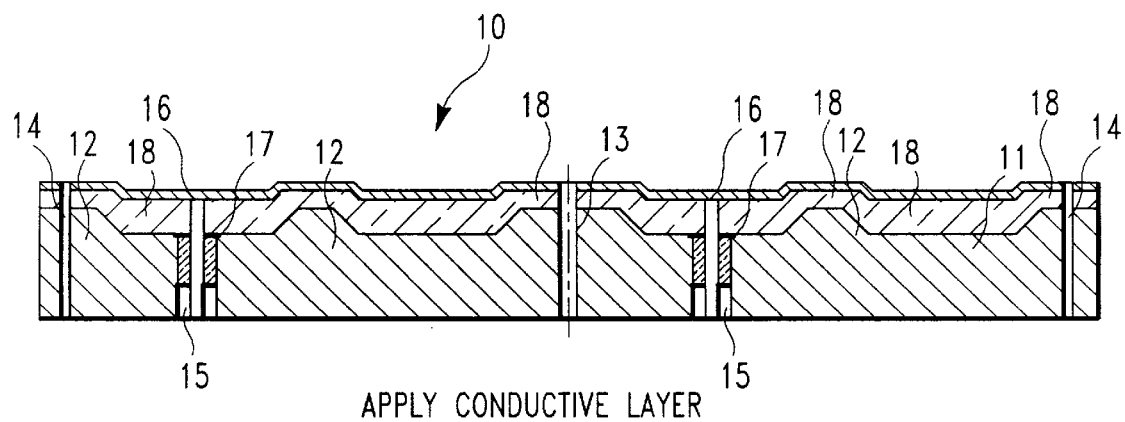
FIG. 4 is a cross sectional view of the electrostatic chuck being formed after application of a conductive layer.

In the next operation and referring to FIG. 4 a conductive layer 19, preferably a conductive ceramic such as aluminum oxide doped with titanium oxide is deposited for forming electrodes, typically to a thickness greater than 0.004 inches (0.102 mm). It is desirable that the height of the ridges 12 be equal to or slightly greater than the thickness of conductive layer 19.

Figure 5:
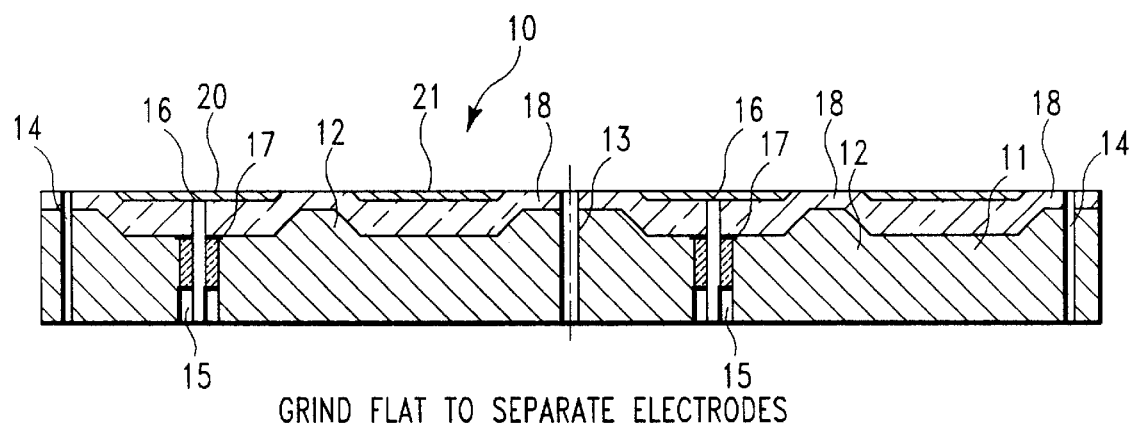
FIG. 5 is a cross sectional view of the electrostatic chuck being formed, after grinding to form separate electrodes.

In FIG. 5, the entire upper surface is ground flat and parallel to base member 11 leaving a net desired electrode thickness, typically 0.004 inches (0.102 mm). This operation separates conductive portions to form separate electrodes 20, 21, by removing portions over the ridge 12 and exposing the first insulating layer 18 in these areas. At this time the conductive 19 layer is also removed around any through holes such as lift pin hole 13 and gas feed hole 14.

Figure 6:
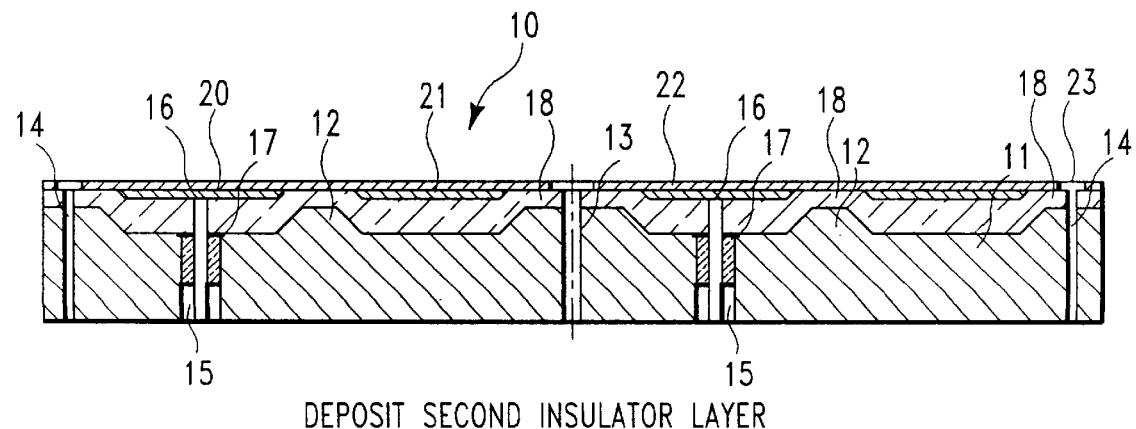
FIG. 6 is a cross sectional view of the electrostatic chuck being formed, showing application of a second insulating layer and shallow surface groove; and, FIG. 7A is a cross sectional view of a completed electrostatic chuck after joining to a support/service plate.

In FIG. 6, a second insulating layer 22 that may be of the same material as first layer 18 is deposited to a thickness greater than the desired final thickness, which desired final thickness is typically 0.006 inches to 0.010 inches (0.153 mm to 0.1254 mm). A final grinding or lapping step is used to achieve the desired surface finish and thickness of the second insulator layer 22. Shallow surface grooves 23 typically 0.002 inches deep, may be cut into the surface for purposes of gas distribution, if needed.

In the final operation and as illustrated in FIG. 7A the conductive base member or disk 11 is then joined to an appropriate supporting frame 24 containing coolant channels 25, electrical connections 26, 27, gas connections 28, 29 and mounting bolt holes (not shown). Base member 11 and supporting frame 24 can be joined at 30 by a variety of methods including epoxy adhesive, metal brazers or simply thermal grease, depending on application requirement. Joint 30 should be thermally conductive but need not be electrically insulative. The capacitance of the joint, if insulative, should be as high as possible for rf plasma application. Alternatively, the conductive base member 11 may contain these frame features as a single monolithic unit as shown in FIG. 7B providing better thermal characteristics and eliminating a joining step.

High and uniform thermal conductivity as well as high and uniform capacitance is achieved by the use of a single appropriate metal for the base member 11. For example, this may be aluminum, titanium or molybdenum. Aluminum can be used for low temperature applications and is less expensive than molybdenum, which is a better thermal expansion coefficient match to the ceramic coatings. Flatness is easily achieved because multiple poles can be easily accommodated in a single base piece which can be ground and need not be aligned critically with other pieces. The use of sprayed ceramic allows thinner (lower thermal resistance) layers for the insulating portions between the clamping surface and the cooling fluid channels. Low cost is achieved because the chuck can be fabricated using only machining, grinding, and thermal spraying methods. No photolithography or screening technology or high temperature firing is needed.

Thus among the advantages of our invention are the following:

1. Monolithic electrostatic clamping surface with a plurality of poles allowing exceptional flatness;

2. Relatively thin ceramic insulating materials for high thermal conductivity and lower voltage operation;

3. Balanced rf coupling;

4. Low cost machining operations for patterning of electrodes; and,

5. Complete isolation of clamping electrodes (poles) from backside cooling gas and from process plasma/gases.

It should be obvious that changes, additions and omissions may be made in the details and arrangements of parts, without departing from the spirit and scope of the invention.

What is claimed is:

1. The method of forming an electrostatic chuck that includes the steps of:

providing a conductive base member;

machining a pattern of ridges in the top surface of the base member;

providing through holes in the base member;

inserting contact posts into through holes and joining same to the base member in such manner that the contact posts extend above the top surface of the base member;

depositing a first insulating layer over the base member top surface, ridges and the contact posts, the thickness of the insulating layer being less than the height of the contact posts above the base member surface;

removing the first insulating layer from the top of the contact posts and removing a portion of contact posts in such manner that the contact posts are flush with the surrounding first insulating layer;

depositing a conductive layer over the first insulating layer and the tops of the contact posts, the thickness of the conductive layer being approximately the height of the ridges;

grinding the top surface of the base member flat to the point of exposing the first insulative layer over the ridges to form separate clamping electrodes; and, depositing a second insulating layer over the conductive layer and first insulating layer.

2. The method of claim 1 including joining the conductive base member to a supporting frame.

3. The method of claim 1 including forming the base member integral with a support which acts as a frame.

4. The product provided by the method of claim 1.

5. The product provided by the method of claim 2.

6. The product provided by the method of claim 3.

* * * * *